United States Patent

Zeng et al.

[11] Patent Number: 6,121,089
[45] Date of Patent: Sep. 19, 2000

[54] METHODS OF FORMING POWER SEMICONDUCTOR DEVICES HAVING MERGED SPLIT-WELL BODY REGIONS THEREIN

[75] Inventors: Jun Zeng, Mountaintop; Carl Franklin Wheatley, Jr., Drums, both of Pa.

[73] Assignee: Intersil Corporation, Palm Beach, Fla.

[21] Appl. No.: 09/092,334

[22] Filed: Jun. 5, 1998

Related U.S. Application Data

[60] Provisional application No. 60/062,312, Oct. 17, 1997.

[51] Int. Cl.[7] .................................................. H01L 21/336
[52] U.S. Cl. ........................ 438/268; 438/270; 438/527; 438/549
[58] Field of Search .................................. 438/299, 301, 438/303, 305, 306, 527, 549, 268, 270

[56] References Cited

U.S. PATENT DOCUMENTS

| | | | |
|---|---|---|---|
| 4,587,713 | 5/1986 | Goodman et al. | 29/576 B |
| 4,835,586 | 5/1989 | Cogan et al. | 357/23.14 |
| 4,980,740 | 12/1990 | Pattanayak et al. | 357/38 |
| 5,034,336 | 7/1991 | Seki | 437/29 |
| 5,057,884 | 10/1991 | Suzuki et al. | 357/23.4 |
| 5,089,864 | 2/1992 | Sakurai | 357/23.4 |
| 5,095,343 | 3/1992 | Klodzinski et al. | 357/23.4 |
| 5,136,349 | 8/1992 | Yilmaz et al. | 357/23.4 |
| 5,160,985 | 11/1992 | Akiyama | 257/145 |
| 5,168,331 | 12/1992 | Yilmaz | 257/331 |
| 5,170,239 | 12/1992 | Hagino | 257/139 |
| 5,171,705 | 12/1992 | Choy | 437/41 |
| 5,198,687 | 3/1993 | Baliga | 257/137 |
| 5,245,202 | 9/1993 | Yasukazu | 257/133 |
| 5,304,821 | 4/1994 | Hagino | 257/133 |
| 5,323,036 | 6/1994 | Neilson et al. | 257/287 |
| 5,326,993 | 7/1994 | Iwamuro | 257/139 |
| 5,338,961 | 8/1994 | Lidow et al. | 257/342 |
| 5,349,212 | 9/1994 | Seki | 257/133 |
| 5,396,087 | 3/1995 | Baliga | 257/139 |
| 5,397,905 | 3/1995 | Otsuki et al. | 257/133 |
| 5,468,668 | 11/1995 | Neilson et al. | 437/51 |
| 5,471,075 | 11/1995 | Shekar et al. | 257/139 |
| 5,485,023 | 1/1996 | Sumida | 257/139 |
| 5,488,236 | 1/1996 | Baliga et al. | 257/132 |
| 5,548,133 | 8/1996 | Kinzer | 257/155 |
| 5,668,026 | 9/1997 | Lin et al. | 438/272 |
| 5,702,961 | 12/1997 | Park | 437/40 |
| 5,742,076 | 4/1998 | Sridevan et al. | 257/77 |
| 5,753,942 | 5/1998 | Seok | 257/133 |

FOREIGN PATENT DOCUMENTS

| | | |
|---|---|---|
| 0 583 028 A1 | 2/1994 | European Pat. Off. . |
| 0 772 244 A1 | 5/1997 | European Pat. Off. . |
| 63-280458 | 11/1988 | Japan . |
| 01132167 | 5/1989 | Japan . |

*Primary Examiner*—T. N. Quach
*Attorney, Agent, or Firm*—Myers Bigel Sibley & Sajovec

[57] ABSTRACT

Methods of forming power semiconductor devices having merged split-well body regions include the steps of forming a semiconductor substrate containing a drift region of first conductivity type (e.g., N-type) therein extending to a first face thereof. First and second split-well body regions of second conductivity type (e.g., P-type) may also be formed at spaced locations in the drift region. First and second source regions of first conductivity type are also formed in the first and second split-well body regions, respectively. A central body/contact region of second conductivity type is also formed in the drift region, at a location intermediate the first and second split-well body regions. The central body/contact region preferably forms non-rectifying junctions with the first and second split-well body regions and a P-N rectifying junction with the drift region at a central junction depth which is less than the maximum well junction depths of the split-well body regions. First and second insulated gate electrodes may also be formed on the first face, opposite respective portions of the first and second split-well regions. Proper choice of drift region resistivity and implant conditions can be used to form a preferred dumbbell-shaped body region and move the location of breakdown within the device to a location which facilitates decoupling of device characteristics. A drift region extension of relatively high conductivity can also be provided along the bottom of the central body region to further limit the degree of coupling between device characteristics.

32 Claims, 10 Drawing Sheets

METHODS OF FORMING POWER SEMICONDUCTOR DEVICES HAVING MERGED SPLIT-WELL BODY REGIONS THEREIN

REFERENCE TO PRIORITY APPLICATION

This application claims priority from Provisional application Ser. No. 60/062312, entitled "Split-Well DMOS Technology", filed Oct. 17, 1997, the disclosure of which is hereby incorporated herein by reference.

FIELD OF THE INVENTION

The present invention relates to semiconductor devices and fabrication methods, and more particularly to power semiconductor devices and methods of forming power semiconductor devices.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to failure if a high current and high voltage are simultaneously applied to the device, as commonly required in inductive power circuit applications, for example. Furthermore, it may be difficult to parallel connect these devices since current diversion to a single device may occur, making emitter ballasting schemes necessary.

The power MOSFET was developed to address this base drive problem. In a power MOSFET, a gate electrode bias is applied for turn-on and turn-off control. Turn-on occurs when a conductive inversion-layer channel is formed in series between the MOSFET's source and drain regions under appropriate bias. The gate electrode is separated from the device's active area by an intervening gate insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the presence of the gate insulator, is a primary feature of the power MOSFET. Moreover, because of the minimal current demands on the gate, the gate drive circuitry can be easily implemented on a single chip. As compared to bipolar technology, the simple gate control typically provides for a large reduction in cost and a significant improvement in reliability.

These benefits may be offset, to some extent, by the typically high on-state resistance of the MOSFET's active region, which arises from the absence of minority carrier injection. This on-state resistance is typically a function of the device's channel resistance, JFET neck resistance and drift region (e.g., epitaxial layer) resistance. As a result, a power MOSFET's operating forward current density may be limited to relatively low values, typically in the range of 10 A/cm$^2$, for a 600 V device, as compared to 40–50 A/cm$^2$ for the bipolar transistor. Notwithstanding this recognized tradeoff in device characteristics, state-of-the-art low voltage power MOSFETs are still expected to simultaneously have extremely low on-state resistance, low power dissipation and high forward blocking voltage capability (e.g., breakdown voltage). Moreover, because power MOSFETs are frequently used in applications which utilize inductive loads, they are also required to have high unclamped inductive switching (UIS) capability (i.e., high "ruggedness").

Simultaneously satisfying each of these requirements, however, has been an illusive goal since each requirement is typically inversely related to at least one other requirement. For example, conventional techniques to increase the blocking voltage capability of a power MOSFET may result in an increase in on-state resistance and techniques to reduce on-state resistance may result in a reduction in UIS capability. The tradeoff associated with these device characteristics may become especially critical when designing MOSFETs to operate at very low control voltages. For example, in conventional DMOS-based power MOSFETs, the contributions of the channel region, the JFET neck region and drift region to the on-state resistance may become comparable. However, because the resistivity and thickness of the drift region are normally predetermined based on a desired forward blocking voltage, most attention has been directed towards reducing channel and JFET neck resistance.

As will be understood by those skilled in the art, the JFET neck resistance can be reduced by using high dose JFET implants and/or wider neck regions, however, these modifications may result in lower breakdown voltage. These modifications may also push the location of breakdown towards the substrate-gate insulator interface (extending opposite the gate electrode) and thereby lower device reliability and UIS capability. As another alternative, the channel resistance can be reduced by establishing higher channel densities during on-state conduction, using shorter channel lengths and lower body region doping concentrations, and using thinner gate oxides. However, the use of short channel lengths may increase parasitic short-channel effects and the use of lower body region doping concentrations may degrade UIS capability because of the higher lateral body region resistance.

Nonetheless, recent attempts have been made to develop high power MOSFETs with low on-state resistance, high breakdown voltage capability and high UIS capability. One such attempt is disclosed in U.S. Pat. No. 5,338,961 to Lidow et al. In particular, the '961 patent discloses a vertical power MOSFET at FIG. 2 which utilizes a relatively highly doped region 40 (shown as N+) on a more lightly doped drift/epitaxial region (shown as N−) to reduce on-state resistance. As illustrated by FIG. 2 of the '961 patent, this relatively highly doped region 40 is formed in the JFET neck region of the MOSFET, between two adjacent body regions 30 and 31 (shown as P+). The breakdown voltage of the MOSFET at FIG. 2 is also described as being increased by the presence of relatively deep body region diffusions (shown as P+) having large radius. Here, the portions of the body regions 30 and 31 which have the greatest depth "X", relative to a face on which a gate electrode 24 is formed, are located opposite ends of respective source regions 32 and 33 which do not contribute to forward conduction through respective channel regions 34 and 35. In other words, the deep portions of the body regions 30 and 31 are spaced away from the central JFET neck region which is located within the relatively highly doped region 40.

Techniques to improve the safe operating area (SOA) of power devices by making them less susceptible to destructive voltage breakdown have also included the use of clamping regions with spherical cross-sections. For example, U.S. Pat. No. 5,135,349 to Yilmaz et al. discloses the use of a clamping region 40 (shown as P+) which extends between adjacent unit cells of a power MOSFET (see, FIG. 3B of the '349 patent) or between adjacent unit cells of an insulated-gate bipolar junction transistor (IGBT) (see, FIG. 3A of the '349 patent). As will be understood by those skilled in the art, an IGBT is a hybrid device which combines bipolar conduction characteristics with MOS-controlled current flow. Here, the clamping region 40 is designed to have a lower breakdown voltage than the adjacent unit cells. The preferred unit cells of FIGS. 3A–3B of the '349 patent also include highly doped deep body regions 48a and 48b which are flanked by more lightly doped body regions 68a–d. (See, e.g., Col. 4, '349 patent). FIG. 4 of the '349 patent also illustrates an IGBT which utilizes a graded doping profile between the highly doped body regions 90a and 90b (in wells 96a and 96b) and the drift region 94, to obtain higher breakdown voltage capability. U.S. Pat. No. 5,057,884 to Suzuki et al. also discloses shallow and deep base/body regions formed in "flat bottom" well regions to reduce parasitic transistor turn-on in a power MOSFET (or parasitic thyristor latch-up in an IGBT). U.S. Pat. Nos. 5,034,336 to Seki, 5,160,985 to Akiyama, 5,326,993 to Iwamuro, and 5,702,961 to Park also disclose power semiconductor devices (e.g., MOSFETs, IGBTs) having deep body region extensions that are flanked by shallower portions of the body region.

However, these attempts may provide only limited success in meeting the above-described design tradeoff in a preferred manner. In particular, although the deep body region extensions of the above described devices may reduce body region resistance and improve UIS capability without significantly increasing on-state resistance or significantly decreasing device breakdown voltage, the location of device breakdown will still likely be within the JFET neck region. This means the transient avalanche current during UIS may still flow laterally across the entire body region (underneath the source region) to reach the body/source contact. As will be understood by those skilled in the art, high levels of such lateral current can turn on a parasitic bipolar junction transistor formed by the drift region, body region and source region and, in the case of an IGBT, induce sustained parasitic thyristor latch-up. The current flow lines associated with this avalanche current are best illustrated by FIG. 1 which is a cross-sectional view of a conventional planar DMOS device containing a drift/epitaxial region 2, body region 3, source region 4, insulated gate electrode 5 and source/body contact 6. The use of highly doped deep body region extensions may also lead to an increased threshold voltage (by increasing the majority carrier dopant concentration in the channel region) and a narrower neck region, and both of these consequences may result in higher on-state resistance, especially when the power MOSFET is used in low voltage applications.

Thus, notwithstanding the above-described attempts to develop higher performance power semiconductor devices which more ideally meet all design tradeoffs, there continues to be a need for improved methods of forming power semiconductor devices and devices formed thereby.

SUMMARY OF THE INVENTION

It is therefore an object of the present invention to provide improved methods of forming power semiconductor switching devices and devices formed thereby.

It is another object of the present invention to provide methods of forming power semiconductor switching devices having preferred characteristics which can be established with greater degrees of independence relative to other characteristics, and devices formed thereby.

It is still another object of the present invention to provide methods of forming power semiconductor switching devices with low on-state resistance and high blocking voltage and UIS capability, and devices formed thereby.

It is still another object of the present invention to provide methods of forming power semiconductor switching devices which are compatible with both planar and trench-based fabrication techniques.

These and other objects, features and advantages of the present invention are provided by methods of forming semiconductor switching devices (e.g., MOSFETs, IGBTs) which include the steps of forming a semiconductor substrate containing a drift region of first conductivity type (e.g., N-type) therein extending to a first face thereof. First and second split-well body regions of second conductivity type (e.g., P-type) may also be formed at spaced locations in the drift region. First and second source regions of first conductivity type are also formed in the first and second split-well body regions, respectively. A central body/contact region of second conductivity type is also formed in the drift region, at a location intermediate the first and second split-well body regions. The central body/contact region preferably forms non-rectifying junctions with the first and second split-well body regions and a P-N rectifying junction with the drift region at a central junction depth which is less than the maximum well junction depths of the split-well body regions. First and second insulated gate electrodes may also be formed on the first face, opposite respective portions of the first and second split-well regions. The first and second insulated gate electrodes may comprise separate stripe-shaped insulated gate electrodes, for example, or opposing portions of an annular-shaped insulated gate electrode.

According to another embodiment of the present invention, methods of forming trench-based power semiconductor switching devices may include the step of forming a semiconductor substrate containing a relatively lightly doped drift region of first conductivity type on a more highly doped substrate region of first conductivity type. A first electrically insulating layer and a first layer of photoresist may also be formed on a first face of the substrate. The layer of photoresist is then patterned using conventional techniques to define a first photoresist mask. The first electrically insulating layer is then selectively etched to define a first implant mask, using the first photoresist mask as an etching mask. Body region dopants of second conductivity type are then implanted into the first face, using the first implant mask as an implant blocking layer. A relatively short duration annealing step may also be performed to drive the body region dopants into the drift region and thereby define a plurality of body regions (shown as P). Source region dopants of first conductivity type are also implanted into the first face, using the first implant mask again as an implant blocking layer. A relatively short duration annealing step may then be performed to drive both the source and body region dopants into the drift region and thereby define a plurality of source regions in respective body regions. First sidewall spacers are then formed in the openings in the first implant mask. These first sidewall spacers may be formed by conformally depositing a low temperature oxide (LTO) layer on the first implant mask and then performing an anisotropic/dry etching step.

A dry etching step is then performed to define a plurality of trenches in the drift region. The first implant mask and first sidewall spacers are then removed to expose the first face. A gate electrode insulating layer is then formed by thermally oxidizing the exposed sidewalls and bottoms of the trenches, however, other techniques besides thermal oxidation may also be used to form the gate electrode insulating layer. The trenches are then filled with respective polysilicon gate electrodes by conformally depositing a blanket layer of polysilicon to fill the trenches and then performing an etch-back step of sufficient duration to expose those portions of the gate electrode insulating layer extending opposite the first face. The exposed portions of the polysilicon gate electrodes are then oxidized using conventional thermal oxidation techniques to electrically isolate the gate electrodes and planarize the substrate. A relatively thick passivation layer is then deposited on the substrate and densified using conventional techniques. Photolithography steps are then performed to define a second photoresist mask and then an etching step is performed with this second photoresist mask to define openings in the passivation layer. Central body region dopants of second conductivity type are then implanted through the openings in the passivation layer and into those portions of the face extending between adjacent trenches. An annealing step is then performed to drive the central body region dopants into the drift region and into the split-well body regions to define a central body/contact region. Like the first embodiment of the present invention, the depth of the junction between a central body region and the drift region is less than the maximum depths of the junctions between the split-well body regions and the drift region at the sidewalls of the trenches. A conventional metallization step is then performed to define a body region contact layer.

These above-described embodiments of the present invention can be utilized to form power semiconductor devices having improved I-V characteristics which result from a decoupling of the typical tradeoffs associated with UIS capability, drain-to-source blocking voltage, specific on-resistance and threshold voltage, for example. In particular, more reliable and robust power semiconductor devices can be obtained by forming the merged body region with a shallow and centrally-located abrupt junction between two deeper split-well body regions. Proper choice of the drift region resistivity and the implant doses and implant energies used to form the preferred body region can also cause the breakdown voltage of the centrally-located abrupt junction between the central body/contact region and the drift region to be reduced relative to the adjacent deeper portions of the body region. This reduction in breakdown voltage can be used advantageously to move the breakdown location from the region near the silicon-gate insulator interface to the centrally located abrupt junction. This movement of the breakdown location to the centrally-located junction causes the degree of coupling between device characteristics to be reduced and provides designers with more freedom to achieve preferred device characteristics for each power device application.

DESCRIPTION OF PREFERRED EMBODIMENTS

Figure 1:
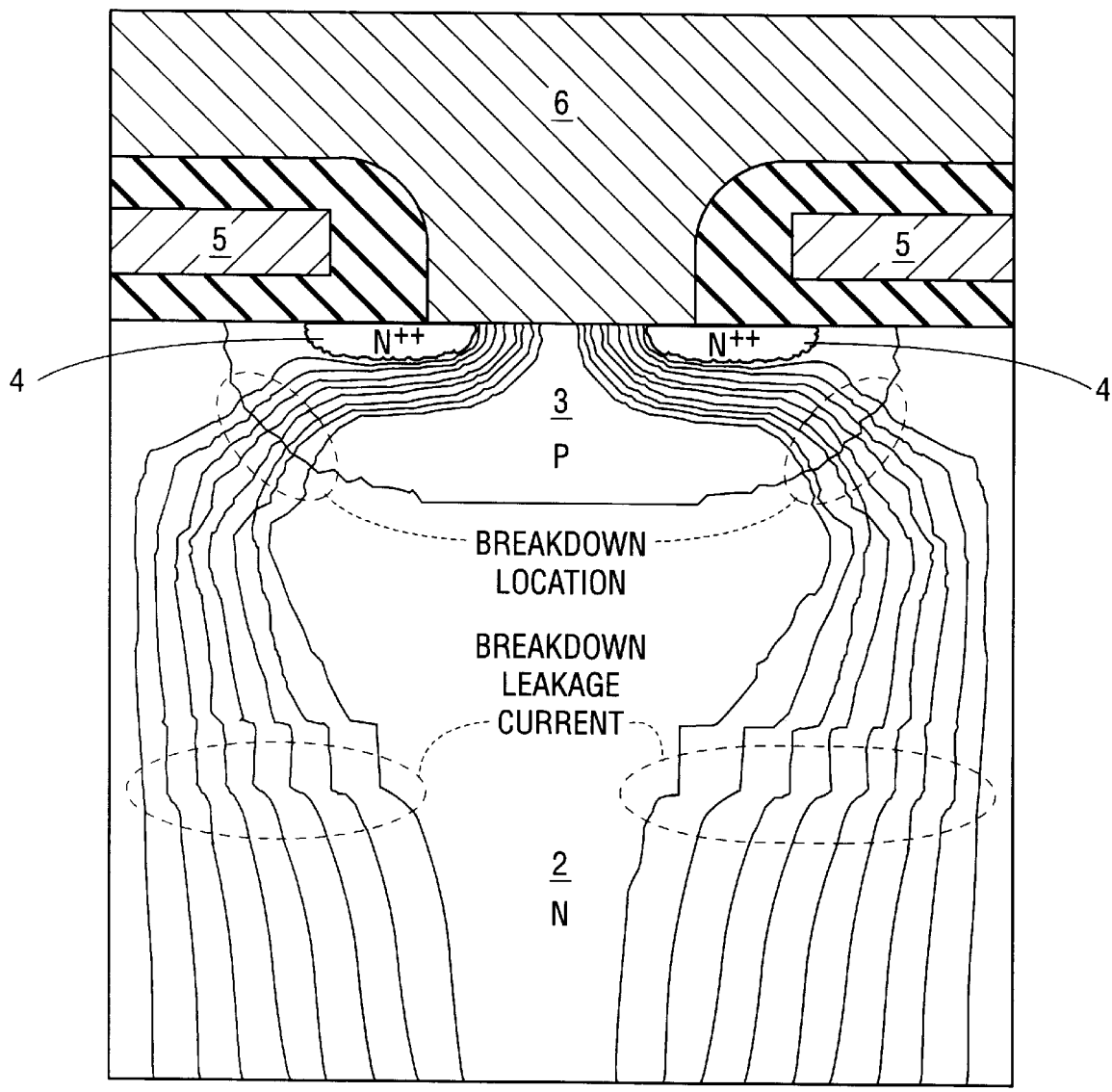
FIG. 1 is a cross-sectional view of a conventional DMOS power semiconductor device which has been highlighted to illustrate leakage current flow lines and the location of breakdown.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Referring now to FIGS. 2A–2H and 3, preferred methods of forming semiconductor switching devices 10 according to a first embodiment of the present invention will be described. In particular, with respect to FIGS. 2H and 3, these preferred methods include the steps of forming a semiconductor substrate 12 containing a drift region 14 of first conductivity type (shown as N--) therein extending to a first face 12a thereof. First and second split-well body regions 16a and 16b of second conductivity type (shown as P) may also be formed at spaced apart locations in the drift region 14. These split-well body regions 16a and 16b form respective P-N junctions with the drift region 14. As illustrated in transverse cross-section, these first and second split-well body regions 16a and 16b may be initially formed as separate stripe-shaped regions which extend in a third dimension (not shown), however, these regions may also constitute opposing portions of a single body region having an annular shape when viewed in a direction normal to the face 12a. Nonetheless, for clarity with respect to the cross-sectional views of FIGS. 2A–2H, these split-well body regions 16a and 16b will be treated herein and in the claims as separate regions.

The preferred methods also include the steps of forming first and second source regions 18a and 18b of first conductivity type (shown as N++) in the first and second split-well body regions 16a and 16b, respectively. Again, as illustrated in transverse cross-section, these first and second source regions 18a and 18b may be formed as separate stripe-shaped regions which extend in a third dimension (not shown), however, these regions may also constitute opposing portions of an annular-shaped source region. Like the split-well body regions 18a and 18b, the first and second source regions 18a and 18b will also be treated herein and in the claims as separate regions. A central body/contact region 20 of second conductivity type (shown as P++/P+) is also formed in the drift region 14, at a location intermediate the first and second split-well body regions 16a and 16b, as illustrated. The central body/contact region 20 preferably forms non-rectifying junctions with the first and second split-well body regions 16a and 16b and a P-N rectifying junction with the drift region 14 at a central junction depth "$d_{cj}$" which is less than the maximum well junction depths "$d_{well}$" of the split-well body regions 16a and 16b. First and second insulated gate electrodes 22a and 22b may also be formed on the first face 12a, opposite respective portions of the first and second split-well regions 16a and 16b. These first and second insulated gate electrodes 22a and 22b may comprise separate stripe-shaped insulated gate electrodes, for example, or opposing portions of an annular-shaped insulated gate electrode.

As determined by the inventors herein, these above-described steps can be utilized to form power semiconductor devices having improved I-V characteristics which result from a decoupling of the typical tradeoffs associated with UIS capability, drain-to-source blocking voltage, specific on-resistance and threshold voltage, for example. In particular, more reliable and robust power semiconductor devices can be obtained by forming the merged body region with a shallow and centrally-located abrupt junction between two deeper split-well body regions 16a and 16b. Proper choice of the drift region resistivity and the implant doses and implant energies used during formation of the preferred body region can also cause the breakdown voltage of the centrally-located abrupt-junction between the central body/contact region 20 and the drift region 14 to be reduced relative to the adjacent deeper portions of the body region. This reduction in breakdown voltage can be used advantageously to move the breakdown location from the region near the silicon-gate insulator interface to the centrally located abrupt junction. As explained more fully hereinbelow with respect to FIG. 3, this movement of the breakdown location to the centrally-located abrupt junction can cause the degree of coupling between device characteristics to be reduced and can provide designers with more freedom to achieve preferred device characteristics for each different power device application.

Figure 2A:
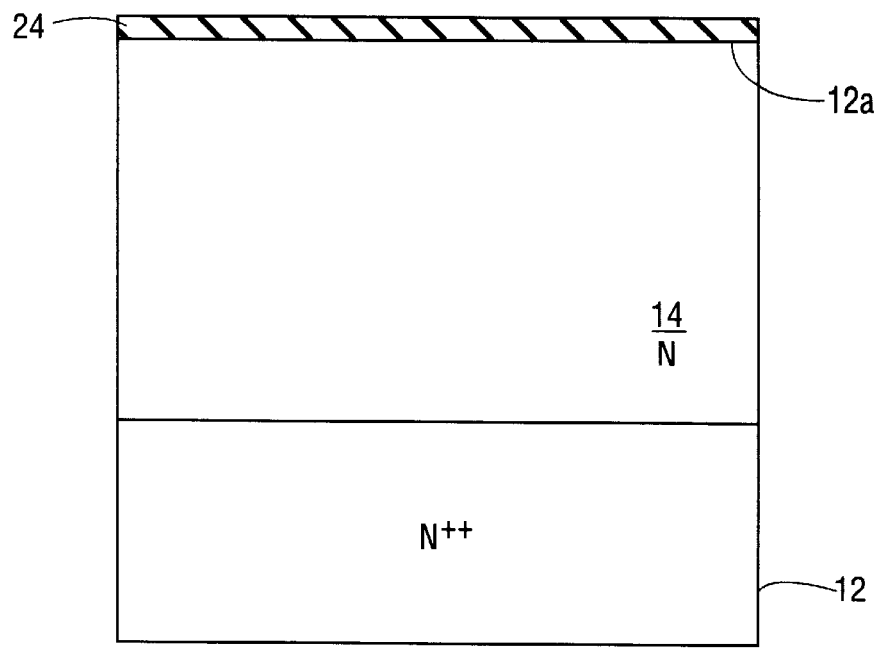
FIGS. 2A–2H are cross-sectional views of intermediate structures which illustrate preferred methods of forming power semiconductor switching devices according to a first embodiment of the present invention.

Referring now specifically to FIG. 2A, preferred methods may include the steps of forming a semiconductor substrate 12 by forming a relatively lightly doped drift region 14 (shown as N--) on a relatively highly doped region of first conductivity type (shown as N++), using epitaxial growth techniques. These epitaxial growth techniques may include in-situ doping steps to obtain a highly uniform or graded doping profile in the drift region 14. Other conventional techniques may also be used to form the drift region 14. According to another embodiment of the invention, the semiconductor substrate 12 may also comprise a relatively highly doped region of second conductivity type (e.g., P+, not shown) with a relatively highly doped buffer region of first conductivity type (e.g., N+, not shown) thereon. In this embodiment, the drift region 14 may be formed as an epitaxial layer in contact with the buffer region. The substrate of this latter embodiment may be particularly useful when forming vertical insulated-gate bipolar junction transistors (IGBTs) having collector regions of second conductivity type (e.g., P+, not shown). Referring still to FIG. 2A, the first conductivity type dopant concentration in the drift region 14 may be set at a level in a preferred range between about $1\times10^{14}$ and $1\times10^{17}$ cm$^{-3}$. A gate insulating layer 24, comprising an electrically insulating material such as $SiO_2$, may also be formed on the first face 12a of the semiconductor substrate 12. This gate insulating layer 24 may have a thickness in a range between about 100 and 1000 Å.

Figure 2B:
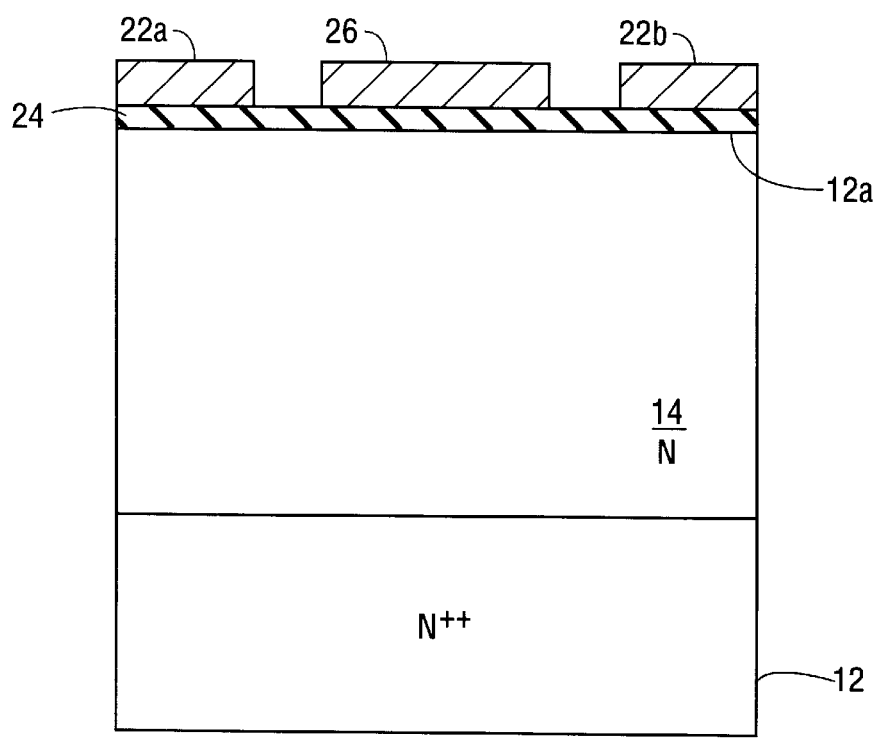

Referring now to FIG. 2B, a gate conductive layer is then formed on the gate insulating layer 24 and patterned using conventional photolithography techniques to define the first and second gate electrodes 22a and 22b and expose a portion of the gate insulating layer 24 extending between the gate electrodes 22a and 22b. The gate insulating layer 24 may also be etched to expose the face 12a, however, it is preferable to maintain the gate insulating layer 24 intact and use the exposed portion of the gate insulating layer 24 to inhibit the occurrence of ion-induced implant damage at the first face 12a of the substrate 12 during subsequent processing. A layer of photoresist may also be patterned as a stripe-shaped exclusion layer 26 on the exposed portion of the gate insulating layer 24, as illustrated. The layer of photoresist is preferably of sufficient thickness to act as an implantation mask during subsequent processing. Alternatively, a portion of the gate conductive layer may also be patterned as the exclusion layer 26.

Figure 2C:
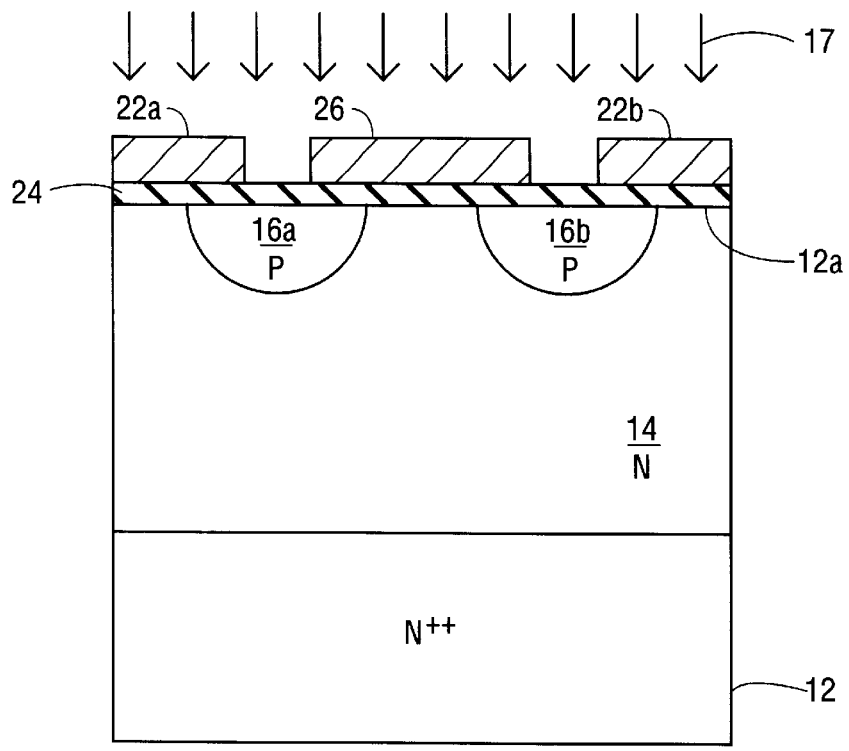
Figure 2D:
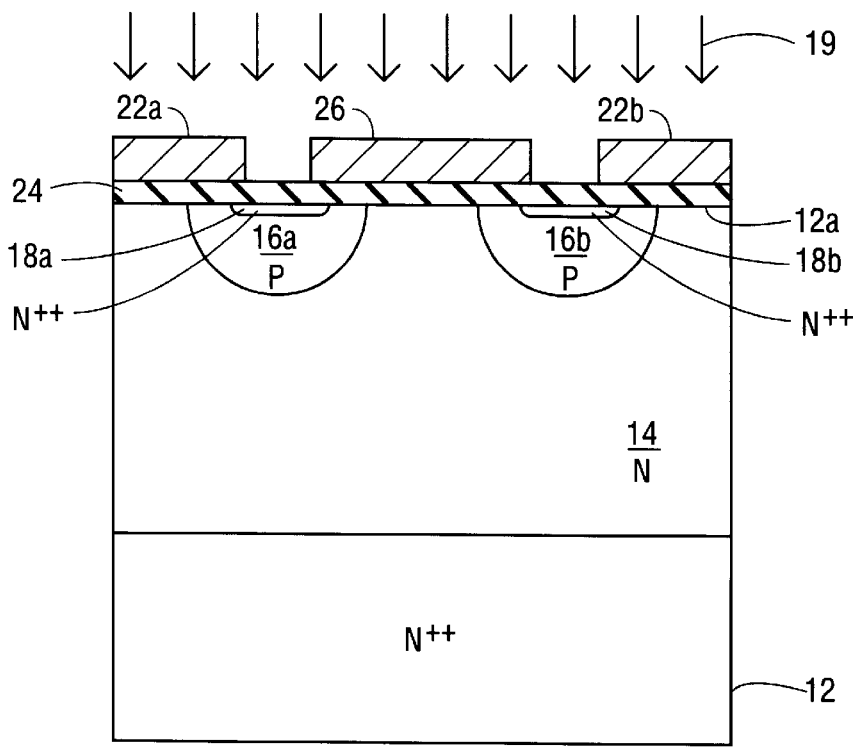

Referring now to FIGS. 2C–2D, split-well region dopants 17 of second conductivity type (e.g., boron) are then implanted into the drift region 14, using the first and second gate electrodes 22a and 22b and exclusion layer 26 as respective implantation masks, to define first and second preliminary split-well regions 16a and 16b. Here, the split-well region dopants 17 are preferably implanted at an implant energy in a range between about 40–100 keV and at a dose level in a range between about $5\times10^{13}$ and $2\times10^{14}$ cm$^{-2}$. Thereafter, using the same implantation masks, source region dopants 19 of first conductivity type (e.g., phosphorus, arsenic) are implanted into the drift region 14 to define first and second preliminary source regions 18a and 18b. These source region dopants 19 are preferably implanted at an implant energy in a range between about 60–120 keV and at a high dose level in a range between about $2\times10^{15}$ and $2\times10^{16}$ cm$^{-2}$. Following these implantation steps, the exclusion layer 26 is removed and then an annealing (i.e., thermal treatment) step of sufficient duration is performed to simultaneously diffuse the split-well region dopants 17 and source region dopants 19 downward and laterally into the drift region 14, and thereby define intermediate split-well regions 16a and 16b and intermediate source regions 18a and 18b. Thus, both implantation and diffusion steps may be performed in sequence to drive-in the split-well and source region dopants. These and the following described implantation steps may be preferably performed by implanting the respective dopants at an angle having a magnitude less than about 6° relative to a normal to the first face 12a. The semiconductor substrate 12 may also comprise a silicon substrate having a crystal orientation in the 100 direction.

Alternatively, the illustrated sequence of the steps of implanting split-well region dopants 17 in FIG. 2C and then implanting source region dopants 19 in FIG. 2D may be reversed, however, such an alternative sequence is less preferred. In addition, after the first and second preliminary split-well regions 16a and 16b are formed and before the source region dopants 19 are implanted, a relatively short duration annealing step may be performed to drive the split-well region dopants 17 downward (and laterally) into the drift region 14 to a preferred depth. Here, the term "drive" or "driving" refers generally to a mechanism(s) for incorporating dopants into a semiconductor region using such techniques as ion implantation and/or diffusion or related techniques such as in-situ doping during epitaxial growth of a semiconductor region. Alternatively, if the width of the exclusion layer 26 is made sufficiently small, the dopants in the split-well regions 16a and 16b may merge upon completion of the short duration annealing step. However, the width of the exclusion layer 26 is preferably set at no less than about 1.6 times the final well junction depth $d_{well}$ illustrated by FIG. 2H.

Figure 2E:
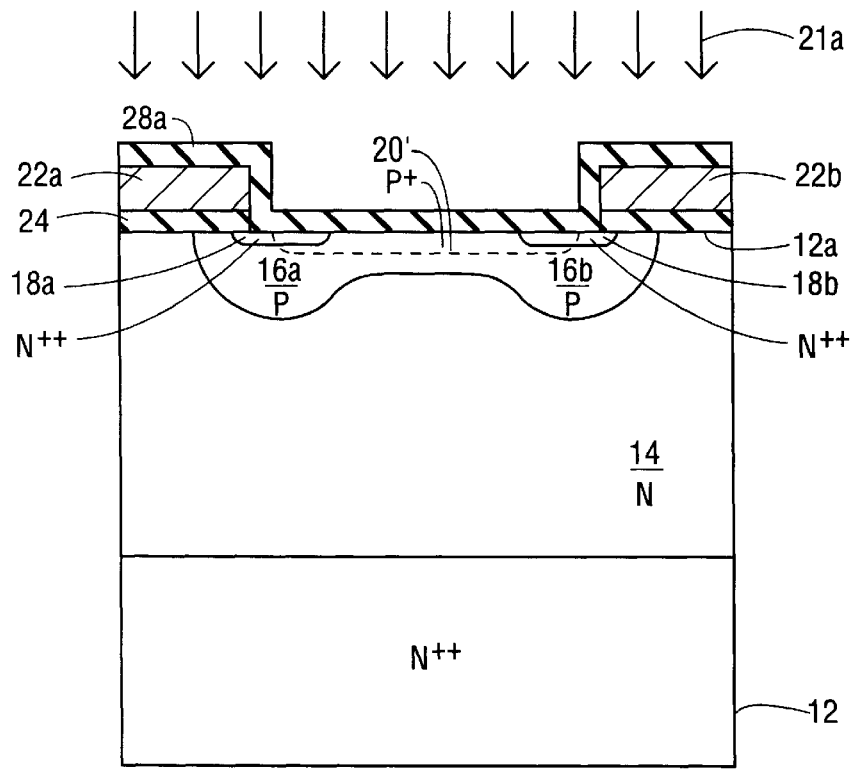

Referring now to FIG. 2E, a first electrically insulating spacer layer 28a is then conformally deposited on upper surfaces and sidewalls of the first and second insulated gate electrodes 22a and 22b, as illustrated. This first electrically insulating spacer layer 28a may comprise a silicon dioxide layer having a thickness in a range between about 500 and 3000 Å. Next, central body region dopants 21a of second conductivity type may be implanted into the drift region 14, using the gate electrodes 22a and 22b and first spacer layer 28a (along the sidewalls of the gate electrodes) as an implant mask. This implantation step is preferably performed to define a preliminary central body region 20'. Here, the central body region dopants 21a may be implanted at an implant energy in a range between about 100–180 keV and at a high dose level in a range between about $1\times10^{15}$ and $5\times10^{16}$ cm$^{-2}$. Following this implant step, an annealing step may be performed to simultaneously drive the split-well, source and central body region dopants into the drift region 14. This annealing step preferably results in the merger of the first and second split-well regions 16a and 16b with the shallower and more highly doped central body region 20. The first electrically insulating spacer layer 28a may then be removed. Although less preferred, this step of implanting central body region dopants 21a may be omitted.

Figure 2F:
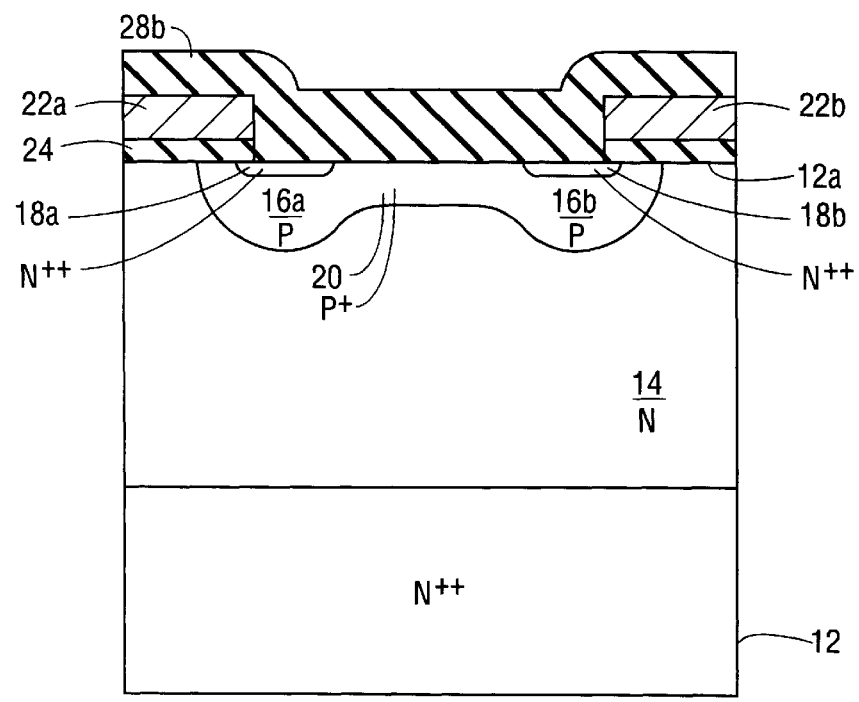
Figure 2G:
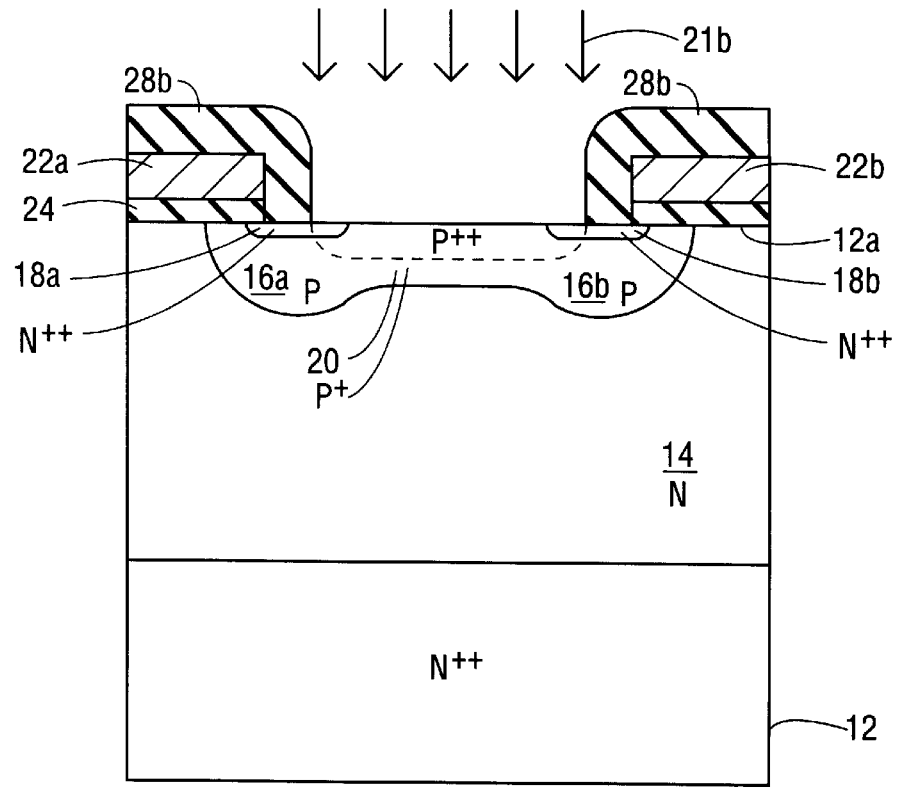
Figure 2H:
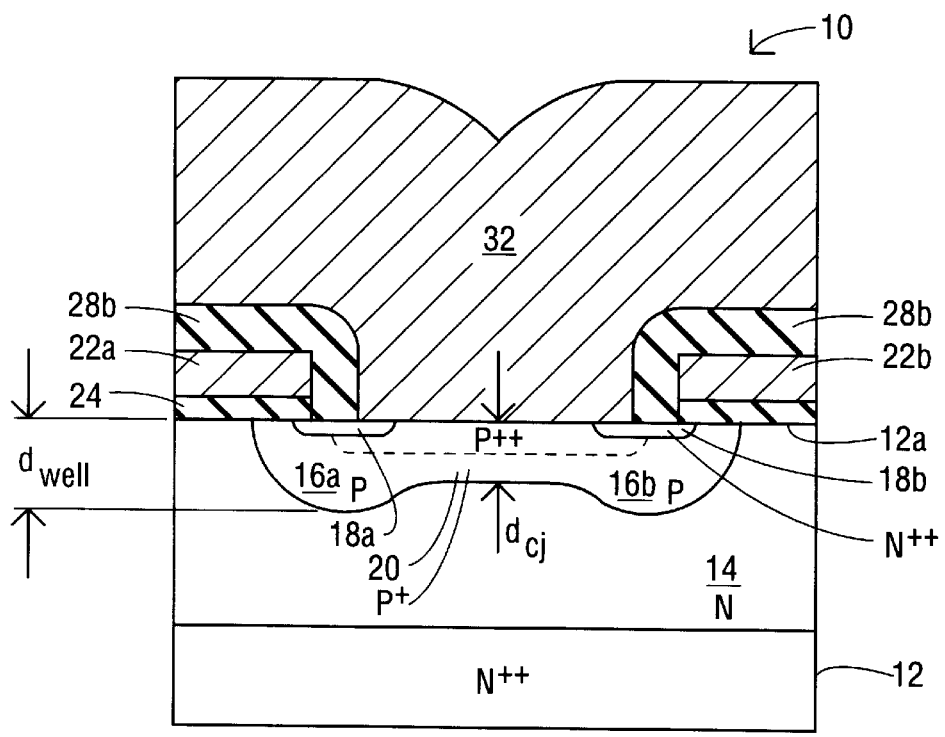
Figure 2I:
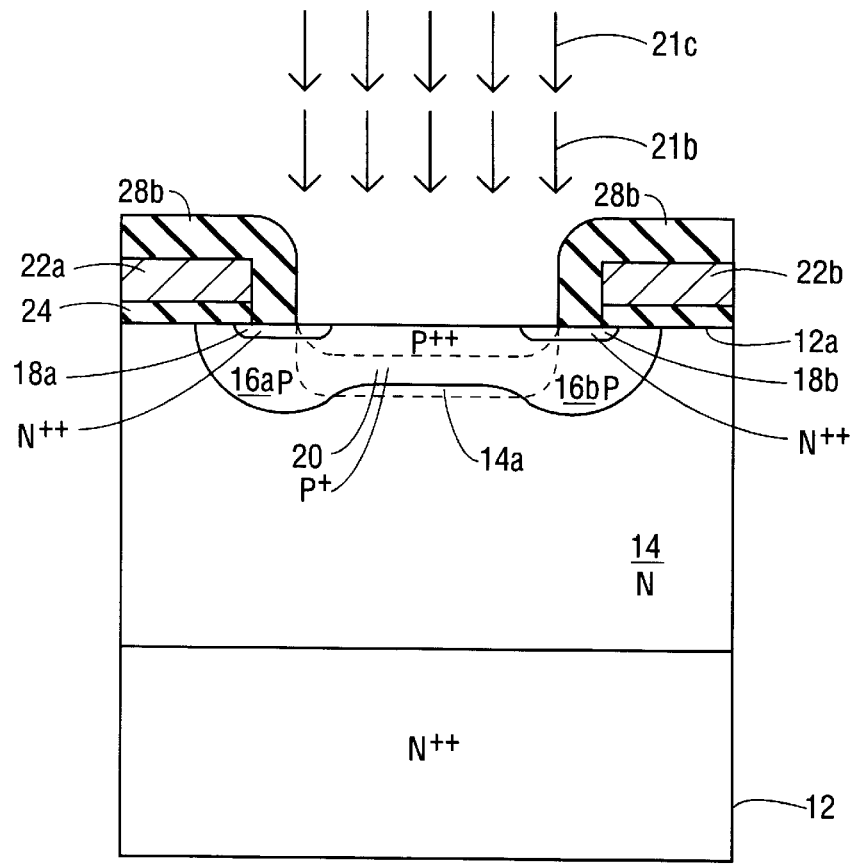
FIG. 2I–2J are cross-sectional views of intermediate structures which, when combined with FIGS. 2A–2F, illustrate preferred methods of forming power semiconductor switching devices according to a second embodiment of the present invention.
Figure 2J:
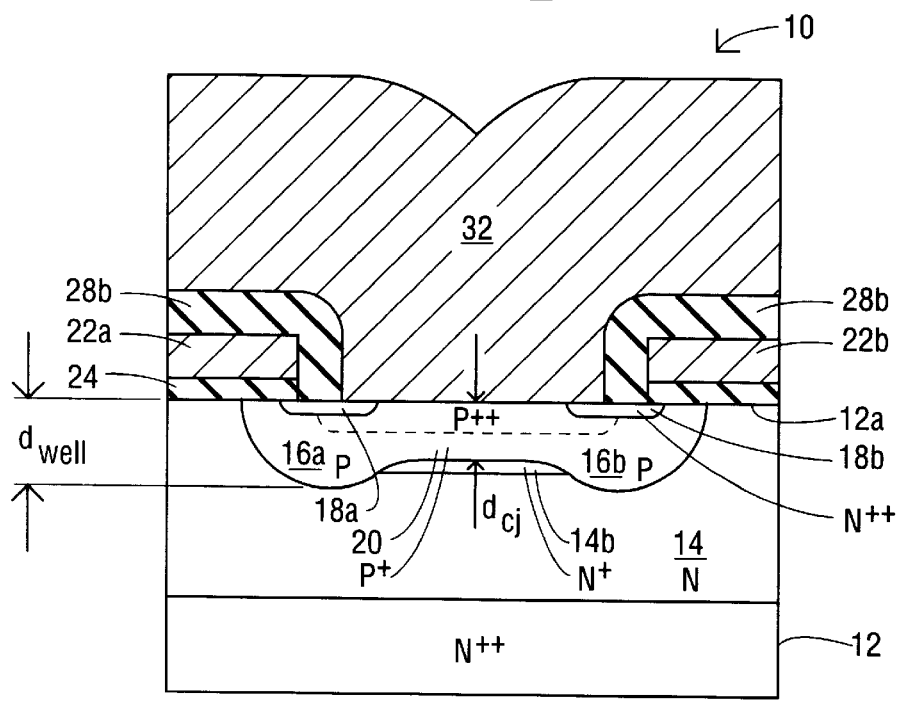

Referring now to FIGS. 2F–2H, a second electrically insulating spacer layer 28b having a thickness in a range between about 5,000–10,000 Å is then conformally deposited on upper surfaces and sidewalls of the first and second insulated gate electrodes 22a and 22b, as illustrated. This second electrically insulating spacer layer 28b may comprise borophosphosilicate glass (BPSG). A selective etching step may then be performed to pattern the second spacer layer 28b and expose the central body region 20, as illustrated by FIG. 2G. Next, contact region dopants 21b of second conductivity type are implanted into the exposed portion of the central body region 20, using the gate electrodes 22a and 22b and second spacer layer 28b as an implant mask. Here, the contact region dopants 21b may be implanted at an implant energy in a range between about 40–180 keV and at a high dose level in a range between about $1\times10^{15}$ and $1\times10^{16}$ cm$^{-2}$. Following this implant step, an annealing step may be performed to complete the drive-in of the implanted dopants and obtain the desired doping profiles and junction depths. Then, as illustrated best by FIG. 2H, conventional metallization techniques are utilized to define a body/source region contact 32.

Referring now to FIGS. 2A–2F and 2I–2J, preferred methods of forming power semiconductor switching devices according to a second embodiment of the present invention will be described. These methods are similar to the methods described with respect to FIGS. 2A–2H, however, as illustrated best by FIG. 2I, the steps associated with FIGS. 2G–2H are modified by adding the step of implanting profile modification dopants 21c of first conductivity type into the exposed portion of the central body region 20, using the gate electrodes 22a and 22b and second spacer layer 28b as an implant mask. Here, the profile modification dopants 21c may be implanted as phosphorus ions at an implant energy in a range between about 100–400 keV and at a relatively high dose level in a range between about $1\times10^{11}$ and $1\times10^{13}$ cm$^{-2}$, to define a preliminary drift region extension 14a within the drift region 14. This step of implanting the profile modification dopants 21c may precede or follow the step of implanting the contact region dopants 21b. Following these implant steps, an annealing step may be performed to complete the drive-in of the implanted contact region dopants 21b and implanted profile modification dopants 21c and obtain the desired doping profiles and junction depths. During this annealing step, dopants in the preliminary drift region extension 14a may also be diffused to define a more highly doped drift region extension 14b (shown as N+) within the drift region 14. Thus, in the illustrated embodiment, a two-sided abrupt P+/N+ junction can be established between the central contact region 20 and the drift region extension 14b. Then, as illustrated best by FIG. 2J, conventional metallization techniques are utilized to define a body/source region contact 32. As determined by the inventors herein, the inclusion of the drift region extension 14b between the split-well regions 16a and 16b (in the lateral direction) and between the central body region 20 and the underlying more lightly doped portion of the drift region 14 (in the vertical direction), as illustrated, can be used to enhance movement of the breakdown location from the region near the silicon-gate insulator interface to the central contact region 20 and thereby further limit the degree of coupling between device characteristics. The inclusion of the drift region extension 14b to increase the degree of abruptness at the P-N junction formed between the central body region 20 and drift region 14 may also be particularly advantageous if the step of implanting central body region dopants 21a, illustrated by FIG. 2E, is omitted.

Figure 3:
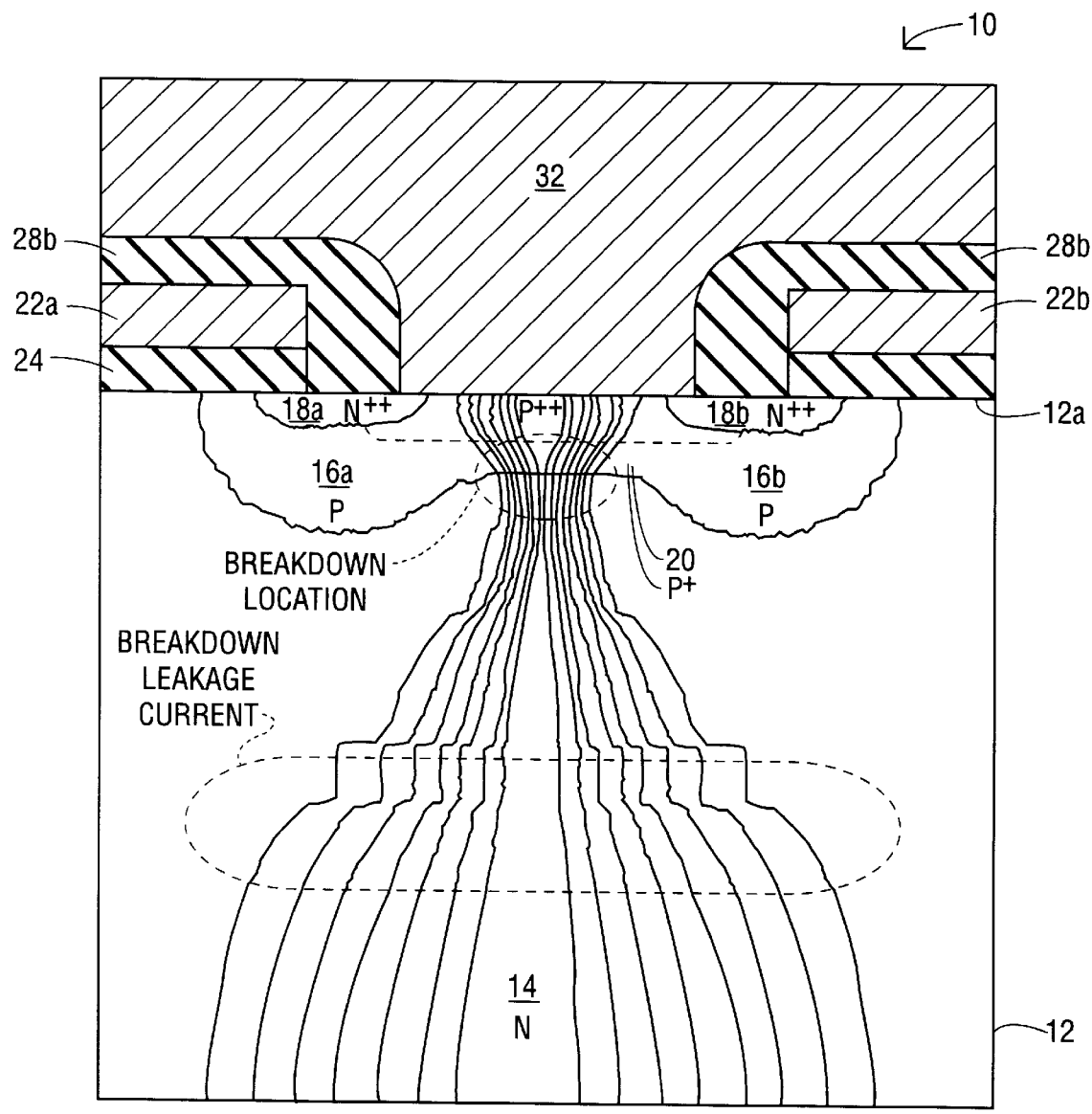
FIG. 3 is a cross-sectional view of a preferred power semiconductor device formed in accordance with the first embodiment of the present invention, which has been highlighted to illustrate leakage current flow lines and the location of breakdown.

As mentioned above, proper choice of the drift region resistivity and the implant doses and implant energies used to form the preferred body region can move the location of breakdown to the shallow abrupt junction and thereby limit the degree of coupling between typical design characteristics. For example, simulations of power semiconductor devices formed with a drift region resistivity of 0.23 Ωcm and a split-well body region junction depth of 1.75 pm (i.e., $d_{well}$=1.75 pm) yielded breakdown voltages of about 33 volts at the shallow abrupt junction when the central body region dopants 21a were implanted at an implant energy of 160 keV and at a dose level of $1\times10^{15}$ cm$^{-2}$. The breakdown voltage associated with conventional technology with the best tradeoff for specific on-resistance is about 38 volts and the location of breakdown is at or near the JFET neck region, as illustrated best by FIG. 1. Extensive two-dimensional simulation of power devices formed in accordance with the methods of FIGS. 2A–2H illustrate that leakage current (at the on-set of avalanche breakdown) is localized at the middle of the body region as illustrated by FIG. 3. Therefore, in contrast to the prior art device of FIG. 1, the leakage current path is shorter and is moved substantially away from the NPN parasitic bipolar junction transistor which is formed by the JFET neck region, split-well body region and source region acting as the collector region, base region and emitter region, respectively.

Different breakdown voltages for the device of FIG. 3 may also be readily achieved by using different dose and implant energies when implanting the central body region dopants 21a. More independence in the design of the JFET neck and channel regions can also be achieved by following the teachings of the present invention, without adversely degrading the device's forward blocking voltage rating. For example, higher JFET implant doses or wider JFET neck regions can typically be used to reduce specific on-resistance without significantly degrading device breakdown voltage because breakdown no longer occurs near the JFET neck region. Thus, whereas the lowest specific on-resistance with the best tradeoff between on-resistance, breakdown voltage and UIS capability is about 1.2mΩcm² for a conventional 30 volt power DMOS device at a gate driving voltage of 4.5 volts, the optimum specific on-resistance of the corresponding device formed in accordance with the present invention is about 0.9mΩcm² for the same forward blocking voltage rating and the UIS capability is also improved. In addition, if desired, the step of implanting the central body region dopants 21a can be eliminated to improve controllability of the threshold voltage by more accurately controlling the characteristics of the channel region.

Figure 4A:
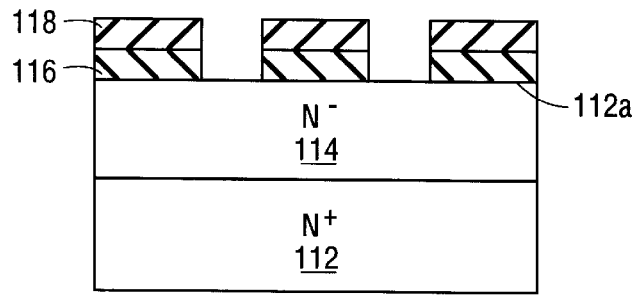
FIGS. 4A–4J are cross-sectional views of intermediate structures which illustrate preferred methods of forming power semiconductor switching devices according to a third embodiment of the present invention.

The preferred characteristics of the first and second embodiments of the present invention can also be achieved in trench-based power switching device technologies. In particular, FIGS. 4A–4J are cross-sectional views of intermediate structures which illustrate preferred methods of forming trench-based power switching devices according to a third embodiment of the present invention. As best illustrated by FIG. 4A, such methods preferably include the step of forming a relatively lightly doped drift region 114 of first conductivity type (shown as N−) on a more highly doped substrate region 112 of first conductivity type (shown as N+), using epitaxial growth techniques, for example. A first electrically insulating layer and first layer of photoresist may also be formed on a first face 12a of the composite semiconductor substrate. The layer of photoresist is then patterned using conventional techniques to define a first photoresist mask 118. The first electrically insulating layer is then selectively etched to define a first implant mask 116, using the first photoresist mask 118 as an etching mask. The first photoresist mask 118 is then removed.

Figure 4B:
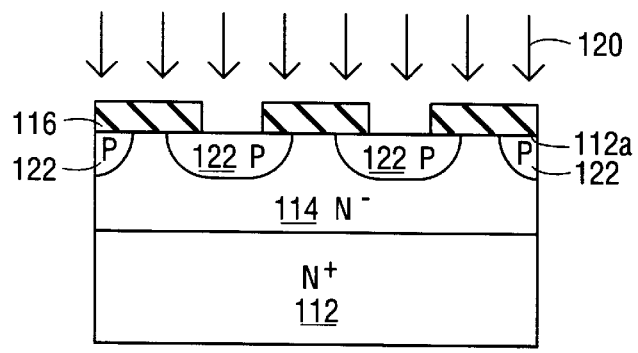
Figure 4C:
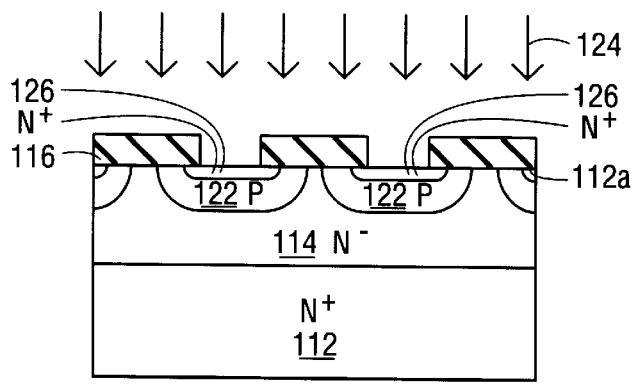
Figure 4D:
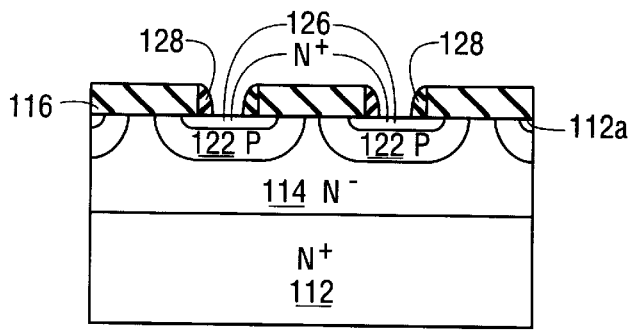

Referring now to FIG. 4B, body region dopants 120 of second conductivity type (e.g., boron) are then implanted into the first face 112a, using the first implant mask 116 as an implant blocking layer. A relatively short duration annealing step may also be performed to drive the body region dopants 120 into the drift region 114 and thereby define a plurality of body regions 122 (shown as P). Referring now to FIG. 4C, source region dopants 124 of first conductivity type (e.g., arsenic, phosphorus) are then implanted into the first face 112a, using the first implant mask 116 as an implant blocking layer. A relatively short duration annealing step may then be performed to drive both the source and body region dopants 124 and 120 into the drift region 114 and thereby define a plurality of source regions 126 (shown as N+) in respective body regions 122. As illustrated best by FIG. 4D, first sidewall spacers 128 are then formed in the openings in the first implant mask 116. These first sidewall spacers 128 may be formed by conformally depositing a low temperature oxide (LTO) layer on the first implant mask 116 and then performing an anisotropic/dry etching step.

Figure 4E:
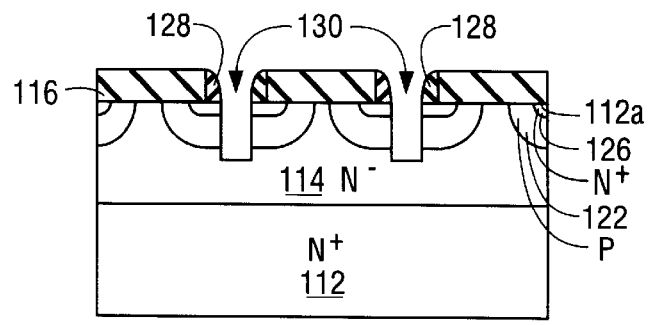
Figure 4F:
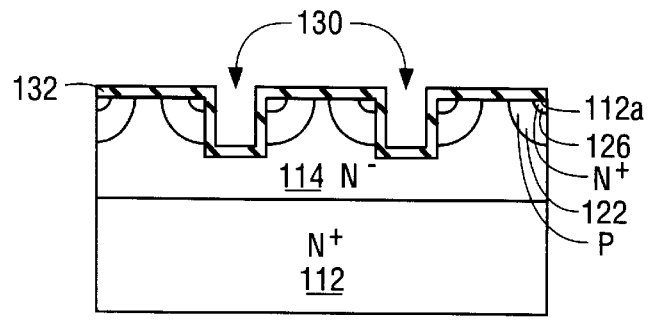
Figure 4G:
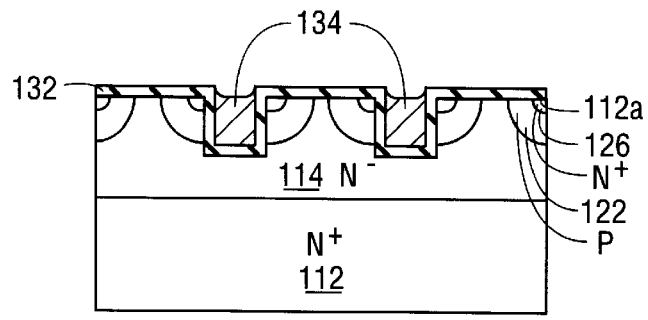

Referring now to FIG. 4E, a reactive ion etching (RIE) step is then performed to define a plurality of trenches 130 in the drift region 114. As will be understood by those skilled in the art, these trenches 130 are self aligned to the centers of the body and source regions 122 and 126. The first implant mask 116 and first sidewall spacers 128 are then removed to expose the first face 112a. Then, as illustrated best by FIG. 4F, a gate electrode insulating layer 132 (e.g., silicon dioxide) is formed by thermally oxidizing the exposed first face 112a and the exposed sidewalls and bottoms of the trenches 130, however, other techniques besides thermal oxidation may also be used to form the gate electrode insulating layer 132. Referring now to FIG. 4G, the trenches 130 are filled with respective polysilicon gate electrodes by conformally depositing a blanket layer of polysilicon to fill the trenches 130 and then performing an etch-back step of sufficient duration to expose those portions of the gate electrode insulating layer 132 extending opposite the first face 112a.

Figure 4H:
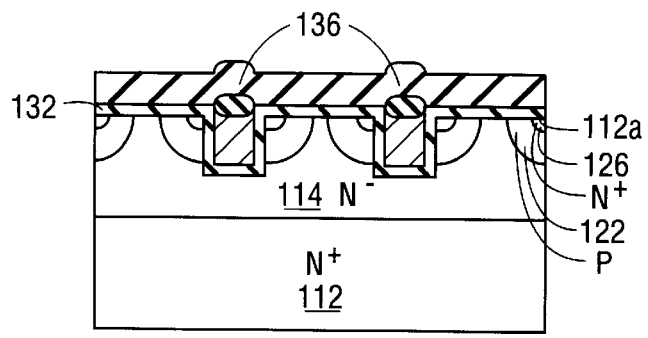

The exposed portions of the polysilicon gate electrodes 134 are then oxidized using conventional thermal oxidation techniques to electrically isolate the gate electrodes 134 and planarize the substrate, as illustrated by FIG. 4H. A relatively thick passivation layer 136 which may comprise BPSG is then deposited on the substrate and densified using conventional techniques.

Figure 4I:
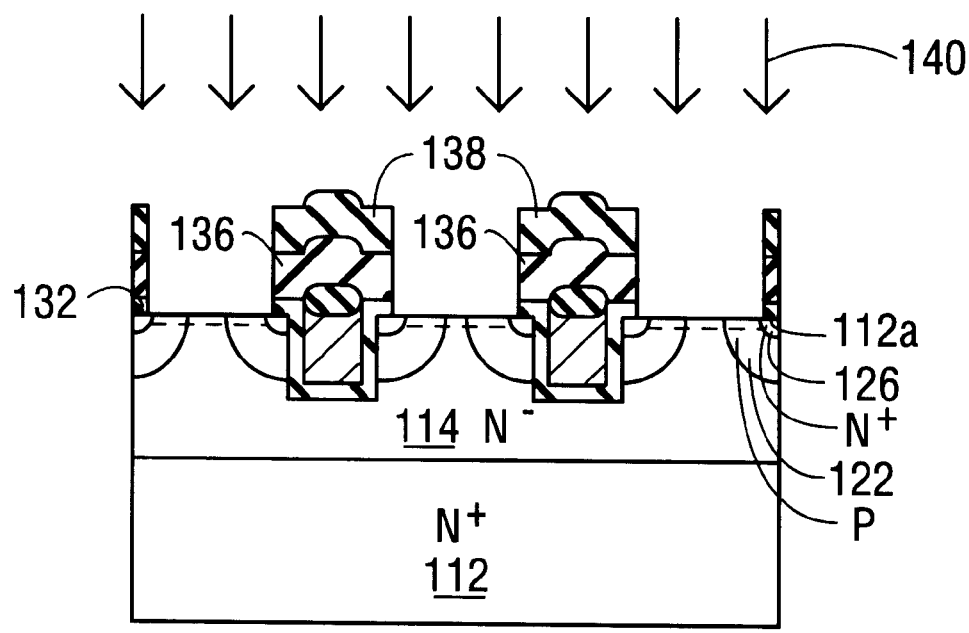
Figure 4J:
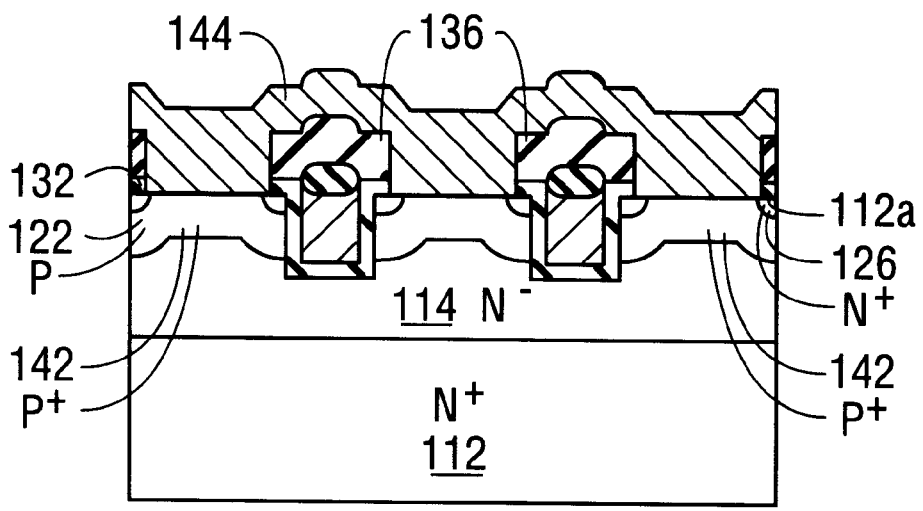

Referring now to FIG. 4I, photolithography steps are then performed to define a second photoresist mask 138 and then an etching step is performed with this second photoresist mask 138 to define openings in the passivation layer 136. Next, central body region dopants 140 of second conductivity type are then implanted through the openings in the passivation layer 136 and into those portions of the face 112a extending between adjacent trenches 130. Like the second embodiment of the present invention, profile modification dopants of first conductivity type (not shown) may also be implanted through the openings in the passivation layer 136. Finally, as best illustrated by FIG. 4J, an annealing step is performed to drive the central body region dopants 140 into the drift region 114 and into the body regions 122 to define a central body/contact region 142 (shown as P+). Like the first embodiment of the present invention, the depth of the junction between a central body region 142 and the drift region 114 is less than the maximum depths of the junctions between the body regions 122 and the drift region 114 (at the sidewalls of the trenches 130). Like the second embodiment, the annealing step may also be performed to drive-in the profile modification dopants and define drift region extensions (not shown). A conventional metallization step is then performed to define a body region contact layer 144.

Accordingly, the present invention can be used with both planar-based and trench-based fabrication technologies to achieve a wide range of power switching devices with preferred and more independently controllable device characteristics. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor switching device, comprising the steps of:

forming a semiconductor substrate containing a drift region of first conductivity type therein extending to a face thereof;

forming first and second split-well body regions of second conductivity type at spaced locations in the drift region, by driving split-well body region dopants into the drift region to achieve first and second maximum well junction depths for the first and second split-well body regions, respectively;

forming a first source region of first conductivity type in the first split-well body region;

forming a central body region of second conductivity type in the drift region at a location intermediate the first and second split-well body regions, by driving central body region dopants into the first and second split-well body regions and into the drift region to achieve a central junction depth which is less than the first and second maximum well junction depths;

forming an insulated gate electrode on the substrate, opposite the first split-well body region; and forming a drift region extension of first conductivity type that forms a first P-N junction with the central body region by selectively implanting profile modification dopants of first conductivity type through the central body region and into the drift region using an implant mask that blocks the profile modification dopants from being implanted into a channel region extending along an interface between the first split-well body region and the insulated gate electrode.

2. The method of claim 1, wherein a first degree of abruptness in doping profile at the first P-N junction between the central body region and the drift region extension is greater than a second degree of abruptness in doping profile at a second P-N junction between the first split-well region and the drift region at the first maximum well junction depth.

3. The method of claim 2, further comprising the step of forming a trench in the substrate that has a sidewall which defines an interface with the first split-well body region and the first source region and a bottom which defines an interface with the drift region; and wherein said step of forming an insulated gate electrode comprises forming an insulated gate electrode in the trench.

4. The method of claim 1, further comprising the step of forming a trench in the substrate; and wherein said step of forming an insulated gate electrode comprises forming an insulated gate electrode in the trench.

5. The method of claim 3, wherein the trench has a sidewall which defines an interface with the first split-well body region and the first source region and a bottom which defines an interface with the drift region.

6. The method of claim 1, wherein said step of forming an insulated gate electrode comprises the steps of:

forming a gate insulating layer on the face; and forming a patterned gate conductive layer on the gate insulating layer, opposite the face.

7. The method of claim 6, wherein said step of forming first and second split-well body regions comprises the step of implanting split-well body region dopants of second conductivity type into the face, using the patterned gate conductive layer as an implant mask; and wherein said step of forming a first source region comprises implanting source region dopants of first conductivity type into the face, using the patterned gate conductive layer as an implant mask.

8. The method of claim 7, wherein said step of implanting split-well body region dopants of second conductivity precedes said step of implanting source region dopants of first conductivity type.

9. The method of claim 7, further comprising the step of forming an exclusion layer on the face; wherein said step of implanting split-well body region dopants of second conductivity type comprises implanting dopants of second conductivity type into the face to define first and second preliminary split-well body regions in the drift region, using the exclusion layer as an implant mask; and wherein said step of implanting source region dopants of first conductivity type comprises implanting source region dopants of first conductivity type into the face to define first and second preliminary source regions in the drift region, using the exclusion layer as an implant mask.

10. The method of claim 9, wherein said step of forming a central body region comprises the steps of:

forming a first spacer on a sidewall of the patterned gate conductive layer; and implanting contact region dopants of second conductivity type into the first and second preliminary source regions to define a preliminary central body region in the drift region, using the first spacer as an implant mask.

11. The method of claim 10, wherein said step of forming a central body region comprises the steps of:

forming a second spacer, thicker than the first spacer, on the sidewall of the patterned gate conductive layer; and implanting contact region dopants of second conductivity type into the preliminary central body region, using the second spacer as an implant mask.

12. The method of claim 10, wherein said step of forming a drift region extension comprises implanting profile modification dopants of first conductivity type through the central body region, using the patterned gate conductive layer as an implant mask.

13. The method of claim 11, wherein said step of forming a drift region extension comprises implanting profile modification dopants of first conductivity type through the central body region using the second spacer as an implant mask.

14. A method of forming a semiconductor switching device, comprising the steps of:

forming a substrate containing an semiconductor drift region of first conductivity type therein extending to a face thereof;

forming a mask having first and second spaced apart openings therein when viewed in transverse cross-section, on the face;

forming first and second split-well body regions at first and second spaced apart locations in the drift region, respectively, by implanting split-well body region dopants of second conductivity type at a first dose level through the first and second openings in the mask and into the drift region and then diffusing the implanted split-well body region dopants to achieve first and second maximum well junction depths for the first and second split-well body regions, respectively;

forming first and second source regions in the first and second split-well body regions, respectively, by implanting source region dopants of first conductivity type through the first and second openings in the mask and into the drift region;

forming a body/contact region by implanting body region dopants of second conductivity type at a second dose level, greater than the first dose level, into a portion of the drift region extending between the first and second spaced apart locations, and then diffusing the implanted body region dopants into the first and second split-well body regions and drift region to achieve a body/drift region junction depth which is less than the first and second maximum well junction depths;

forming an insulated gate electrode on the substrate, opposite the first splitwell body region; and forming a drift region extension of first conductivity type that forms a first P-N junction with the body/contact region by selectively implanting profile modification dopants of first conductivity type through the body/contact region and into the drift region using an implant mask that covers the insulated gate electrode and blocks a first interface between the insulated gate electrode and the first split-well body region from being exposed to the implanted profile modification dopants.

15. The method of claim 14, wherein a first degree of abruptness in doping profile at the first P-N junction between the body/contact region and the drift region extension is greater than a second degree of abruptness in doping profile at a second P-N junction between the first split-well region and the drift region at the first maximum well junction depth.

16. The method of claim 15, further comprising the step of forming first and second trenches in the substrate; wherein said step of forming an insulated gate electrode comprises forming first and second insulated gate electrodes in the first and second trenches, respectively, wherein the first trench has a sidewall which defines the first interface; and wherein the second trench has a sidewall which defines a second interface between the second split-well body region and the second insulated gate electrode.

17. The method of claim 15, wherein said step of forming mask comprises the steps of forming a polysilicon conductive layer on the face, patterning the polysilicon conductive layer to define an opening therein and forming an exclusion layer in the opening; and wherein said step of implanting body region dopants of second conductivity type at a second dose level is preceded by the step of removing the exclusion layer.

18. The method of claim 15, wherein said step of implanting split-well body region dopants precedes said step of implanting source region dopants.

19. A method of forming a semiconductor switching device, comprising the steps of:
   forming a semiconductor substrate containing a drift region of first conductivity type therein extending to a face thereof;
   forming first and second split-well body regions of second conductivity type having first and second maximum well junction depths, respectively, at spaced apart locations in the drift region;
   forming a first source region of first conductivity type in the first split-well body region;
   forming a central body region of second conductivity type in the drift region at a location intermediate the first and second split-well body regions, the central body region having a central junction depth which is less than the first and second maximum well junction depths;
   forming an insulated gate electrode on the substrate, opposite the first split-well body region; and
   forming a drift region extension of first conductivity type that forms a first P-N junction with the central body region and a non-rectifying junction with the drift region by selectively implanting profile modification dopant of first conductivity type into the drift region using an implant mask that covers the insulated gate electrode and blocks an interface between the insulated gate electrode and the first split-well body region from being exposed to the implanted profile modification dopants.

20. The method of claim 19, wherein a first degree of abruptness in doping profile at the first P-N junction between the central body region and the drift region extension is greater than a second degree of abruptness in doping profile at a second P-N junction between the first split-well region and the drift region at the first maximum well junction depth.

21. The method of claim 20, further comprising the step of forming a trench in the substrate; wherein the trench has a sidewall which defines an interface with the first split-well body region and the first source region and a bottom which defines an interface with the drift region; and wherein said step of forming an insulated gate electrode comprises forming an insulated gate electrode in the trench.

22. The method of claim 19, further comprising the step of forming a trench in the substrate; and wherein said step of forming an insulated gate electrode comprises forming an insulated gate electrode in the trench.

23. The method of claim 19, wherein said step of forming an insulated gate electrode comprises the steps of forming a gate insulating layer on the face and forming a patterned gate conductive layer on the gate insulating layer, opposite the face; wherein said step of forming first and second split-well body regions comprises the step of implanting split-well body region dopants of second conductivity type into the face, using the patterned gate conductive layer as an implant mask; wherein said step of forming a first source region comprises implanting source region dopants of first conductivity type into the face, using the patterned gate conductive layer as an implant mask; and wherein said step of implanting split-well body region dopants of second conductivity precedes said step of implanting split-well body region dopants of first conductivity type.

24. The method of claim 23, further comprising the step of forming an exclusion layer on the face; wherein said step of implanting split-well body region dopants of second conductivity type comprises implanting split-well body region dopants of second conductivity type into the face to define first and second preliminary split-well body regions in the drift region, using the exclusion layer as an implant mask; and wherein said step of implanting source region dopants of first conductivity type comprises implanting source region dopants of first conductivity type into the face to define first and second preliminary source regions in the drift region, using the exclusion layer as an implant mask.

25. A method of forming a semiconductor switching device, comprising the steps of:
   forming a substrate containing a semiconductor drift region of first conductivity type therein;
   forming a body region of second conductivity type that extends in the drift region and forms a first P-N junction therewith;
   forming a source region of first conductivity type that extends in the body region and forms a second P-N junction therewith;
   forming an insulated gate electrode that extends on a surface of the substrate and opposite a portion of the body region which acts as a channel region of second conductivity type when the switching device is biased in a forward on-state mode of operation; and
   forming a drift region extension of first conductivity type that extends from the drift region to a third P-N rectifying junction with the body region, by selectively implanting profile modification dopants of first conductivity type through a portion of the body region and into the drift region using an implant mask that blocks the channel region of second conductivity type from being compensated by the implanted profile modification dopants of first conductivity type.

26. The method of claim 25, wherein a degree of abruptness on the drift region side of the first P-N junction is less than a degree of abruptness on the drift region extension side of the third P-N junction.

27. The method of claim 25, wherein the drift region extends to a face of the substrate; and wherein the insulated gate electrode is formed on the face.

28. The method of claim 27, wherein the implant mask covers the insulated gate electrode.

29. The method of claim 25, wherein the substrate comprises a trench therein; wherein the drift region extends to a sidewall of the trench; and wherein the channel region extends to the sidewall of the trench.

30. The method of claim 29, wherein the implant mask covers the insulated gate electrode.

31. The method of claim 25, wherein application of a gate voltage of sufficient magnitude to the insulated gate electrode induces formation of an inversion-layer channel in the channel region when the switching device is biased in the forward on-state mode.

32. A method of forming a semiconductor switching device, comprising the steps of:

forming a substrate containing a semiconductor drift region of first conductivity type therein, a body region of second conductivity type in the drift region and a source region of first conductivity type in the body region;

forming an insulated gate electrode that extends on a surface of the substrate and defines an interface with the base region; and forming a drift region extension of first conductivity type that extends from the drift region to a P-N rectifying junction with the body region, by selectively implanting profile modification dopants of first conductivity type through a portion of the body region and into the drift region using an implant mask that blocks the profile modification dopants from being implanted into a portion of the body region that extends along the interface between the body region and the insulated gate electrode.

* * * * *

UNITED STATES PATENT AND TRADEMARK OFFICE
CERTIFICATE OF CORRECTION

PATENT NO. : 6,121,089
DATED : September 19, 2000
INVENTOR(S) : Zeng et al.

It is certified that error appears in the above-identified patent and that said Letters Patent is hereby corrected as shown below:

Title page,
Item [73] Assignee,
Please delete "Palm Beach" and substitute -- Palm Bay -- therefor.

Item [56] References Cited

U.S. PATENT DOCUMENTS
| | | | |
|---|---|---|---|
| 5,130,272 | 7/1992 | Feria et al. | 438/549 |
| 4,883,767 | 11/1989 | Gray et al. | 438/549 |

OTHER REFERENCES
Baliga, B., "Power Semiconductor Devices, PWS Publishing Company, 1996, pp. 20, 21, 336-339
International Search Report, PCT/US98/22041, July 27, 1999

Signed and Sealed this

Twentieth Day of November, 2001

Attest:

NICHOLAS P. GODICI

*Attesting Officer*  *Acting Director of the United States Patent and Trademark Office*